(12) United States Patent
Nagano et al.

(10) Patent No.: US 6,480,005 B2
(45) Date of Patent: Nov. 12, 2002

(54) ELECTRICAL CONNECTION TESTING DEVICE AND AN ELECTRICAL CONNECTION TESTING METHOD FOR TERMINAL FITTINGS ACCOMMODATED IN A CONNECTOR

(75) Inventors: Yuji Nagano, Yokkaichi (JP); Nobuhiro Suzuki, Yokkaichi (JP); Akira Nishino, Yokkaichi (JP)

(73) Assignee: Sumitomo Wiring Systems, Ltd. (JP)

( * ) Notice: Subject to any disclaimer, the term of this patent is extended or adjusted under 35 U.S.C. 154(b) by 29 days.

(21) Appl. No.: 09/772,809

(22) Filed: Jan. 30, 2001

(65) Prior Publication Data

US 2001/0013782 A1 Aug. 16, 2001

(30) Foreign Application Priority Data

Feb. 10, 2000 (JP) .......................... 2000-033643
Feb. 22, 2000 (JP) .......................... 2000-044583

(51) Int. Cl.$^7$ .............................................. H01H 31/04
(52) U.S. Cl. ...................... 324/538; 439/289; 439/310; 439/701
(58) Field of Search ............................ 324/72.5, 538, 324/754; 439/289, 310, 680, 701

(56) References Cited

U.S. PATENT DOCUMENTS

| | | |
|---|---|---|
| 4,734,651 A | 3/1988 | Keller et al. |
| 5,627,473 A | 5/1997 | Takani |
| 5,744,966 A * | 4/1998 | Sato .......................... 324/538 |
| 5,777,480 A * | 7/1998 | Hatagishi et al. ........... 324/538 |
| 5,831,438 A * | 11/1998 | Okura ......................... 324/538 |
| 5,877,622 A * | 3/1999 | Aoyama et al. ........... 324/158.1 |
| 6,081,124 A * | 6/2000 | Chiyoda ..................... 324/538 |
| 6,316,951 B1 * | 11/2001 | Chiyoda ..................... 324/754 |

FOREIGN PATENT DOCUMENTS

| | | |
|---|---|---|
| EP | 0 822 616 A2 | 2/1998 |
| JP | 62177460 | 8/1987 |
| JP | 06-258373 | 9/1994 |
| JP | 2000137052 | 5/2000 |
| WO | WO00/38279 | 6/2000 |
| WO | WO 01/14896 A1 * | 3/2001 ........... G01R/31/04 |

* cited by examiner

*Primary Examiner*—N. Le
*Assistant Examiner*—Walter Benson
(74) *Attorney, Agent, or Firm*—Anthony J. Casella; Gerald E. Hespos

(57) ABSTRACT

An electrical connection testing device is provided with a connector holder (12), first and second probe holders (13, 14) which are successively arranged such that the connector holder (12) and the second probe holder are movable toward and away from the connector holder (12). A pushing mechanism (18) for pushing a receiving surface (14*d*) of the second probe holder (14) at the opposite side from the connector holder (12) is so coupled with the second probe holder (14) as to be movable toward and away from the second probe holder (14). The second probe holder (14) and the connector holder (12) are moved according to the movement of the pushing mechanism (18), thereby being positioned at testing positions (P1) where probes (16, 17) are inserted into testing holes (1*a*) of a connector (C) from opposite sides or at retracted positions (P2) where the connector can be taken out of a connector holder (12).

15 Claims, 17 Drawing Sheets

ELECTRICAL CONNECTION TESTING DEVICE AND AN ELECTRICAL CONNECTION TESTING METHOD FOR TERMINAL FITTINGS ACCOMMODATED IN A CONNECTOR

BACKGROUND OF THE INVENTION

1. Field of the Invention

The present invention relates to an electrical connection testing device and to an electrical connection testing method for terminal fittings accommodated in a connector.

2. Description of the Related Art

Electrical connection testing devices are used to test electrical connections of terminal fittings that are accommodated in cavities of a connector. The connector has an engaging side, and the cavities have through openings at the engaging side for receiving the terminal fittings of a mating connector. The typical prior art electrical testing device functions by inserting testing probes into the through openings of the cavities at the engaging side of the connector and bringing the leading ends of the probes into contact with the terminal fittings that are locked in the cavities.

Female terminal fittings present a problem with the above-described electrical connection devices because only hollow portions of the female terminal fittings can be seen from the probe inserting side and because end surfaces of the female terminal fittings that are contacted by the probes cannot be seen. Further, the probes are inserted toward the terminal fittings in the same direction as the inserting direction of the mating terminal fittings, and hence the probes may damage the terminal fittings and/or the connector. Accordingly problems of reliability in electrical contact and connection precision may arise during connection with a mating connector.

In view of the above, electrical connecting testing devices for female terminal fittings typically are of the side probe type. More particularly, testing holes are formed in side walls of a connector housing and extend in a direction normal to a terminal inserting direction. The testing probes then are inserted through the testing holes in the side walls instead of being inserted through the openings at the leading ends of cavities. Thus, the testing probes contact the sides of the terminal fittings.

The applicant of the present invention proposed an electrical connection testing apparatus of the side probe type, as shown in FIG. 17 of Japanese Unexamined Patent Publication No. 6-258373. This device is constructed such that probes 2 are inserted into testing holes 1a formed in one side wall of a connector 1. The probes 2 are L-shaped. Leading ends of the probes 2 are bent to extend down and are inserted into the testing holes 1a.

The above-described testing apparatus has testing holes 1a that can be formed only in one side wall (upper wall in FIG. 8) of the connector 1. Thus, only one stage of cavities can be provided in the connector 1. Many connectors are formed with cavities arrayed at two stages, and the above device cannot be applied to such connectors.

In view of the above problem, an object of the present invention is to provide an electrical connection testing device of the side probe type and an electrical connection method which allow for an easy testing of two stage connectors.

SUMMARY OF THE INVENTION

The subject invention is directed to an electrical connection testing device for testing electrical connections of terminal fittings in a connector. The testing is carried out by inserting testing probes at least partly through testing holes formed in side walls of a connector housing. The testing holes extend at an angle different from 0° or 180° to a mating direction of the terminal fittings with mating terminal fittings, and preferably substantially normal thereto. Thus, the testing probes can be brought elastically into contact with side surfaces of the terminal fittings of the connector.

The electrical connection testing device comprises a connector holder that is adapted to hold the connector. The connector holder is formed with probe insertion holes through which the probes can be inserted for contact with the terminal fittings of the connector.

The electrical connection testing device further includes first and second probe holders that carry the respective probes. A relative movement mechanism is provided for displacing the first probe holder, the second probe holder and/or the connector holder with respect to each other to insert the probes into the probe insertion holes and into contact with the terminal fittings of the held connector.

The testing device may comprise a base to which the first probe holder is secured. The connector holder and the second probe holder may be provided successively on the base for movement toward and away from the first probe holder.

The relative displacement mechanism preferably comprises a pushing mechanism for pushing a receiving surface of one of the probe holders at a side opposite from the connector holder. For example, the second probe holder and the connector holder may be moved toward the first probe holder by moving the pushing mechanism toward the second probe holder. This movement positions the probes at testing positions where the probes can be inserted into testing holes of a connector from substantially opposite sides.

The connector holder may be formed with opposite side walls that have probe insertion holes, and the first and second probe holders may be arranged to face the opposite side walls of the connector holder. The pushing mechanism may be operative to push the second probe holder and the connector holder toward the first probe holder for inserting the probes into testing holes of a connector from opposite sides. Accordingly, the probes are brought into contact with the terminal fittings at the opposite sides to conduct an electrical connection test merely by having the pushing mechanism move the second probe holder toward the first probe holder and into the testing position. Thus operability can be improved.

Upon completion of a test, the connector holder and the second probe holder can be moved by a linking or pushing mechanism from the testing positions to retracted positions so that the tested connector can be removed from the connector holder and replaced by another connector. Specifically, the pushing mechanism is at its retracted position when the connector is placed into the connector holder. Accordingly, the probe holders and the connector holder also are at retracted positions and away from each other in this state and wait on standby at such positions so that they do not interfere with the connector that is being inserted or taken out. The pushing mechanism then exerts forces on the receiving surface of the second probe holder and pushes the second probe holder toward the first probe holder after the next connector is placed in the connector holder. Thus, the second probe holder interferes with one side of the connector holder to push the connector holder toward the first probe holder. Consequently, spaces between the first probe holder and the connector holder and between the connector holder and the second probe holder are narrowed to reach the specified testing positions. In these positions, the leading ends of the probes are inserted through the probe insertion holes of the connector holder, into the testing holes of the connector and into elastic contact with the respective terminal fittings to conduct an electrical connection test.

The pushing mechanism is moved away from the second probe holder after the electrical connection test, and the linking mechanism returns the connector holder and the second probe holder to the retracted positions. Thus, the respective probes are withdrawn from the testing holes of the connector, and the connector can be taken out of the connector holder.

The pushing mechanism preferably comprises a lever pivotally mounted at an end of a base or at the connector holder. A cam of the lever pushes the receiving surface of the second probe holder and/or a receiving surface of the first probe holder as the operable lever is pivoted.

The relative displacement mechanism preferably comprises a retraction linking mechanism for moving the second probe holder and the connector holder together to retracted positions where the connector can be mounted into and taken out of the connector holder. The retraction linking mechanism preferably is operated by moving the pushing mechanism away from the second probe holder. Specifically, the retraction linking mechanism may comprise springs between the first probe holder and the connector holder and between the connector holder and the second probe holder for biasing the holders away from each other. A pushing force on the second probe holder is released by moving the pushing mechanism away from the second probe holder. As a result, the first probe holder and the connector holder, and the connector holder and the second probe holder are separated from each other and move together to the retracted positions by the biasing action of the springs.

The retraction linking mechanism may alternatively comprise a first link between the connector holder and the second probe holder and a second link between the second probe holder and the pushing mechanism. In such a case, no spring biases the second probe holder and the connector holder to the retracted positions. Accordingly, no large force is required by the pushing mechanism to move the second probe holder and the connector holder to the testing positions, thereby improving operability.

Preferably, at least one of the first and second probe holders comprises a stopper for preventing relative movements of the first and second probe holders to the testing positions. The stopper may function by interfering with a retainer that is mounted on the connector, and preferably on a terminal inserting surface of the connector. More particularly, the stopper may interfere with the retainer when the retainer is insufficiently inserted into the connector. In the case that the retainer of the connector is insufficiently inserted, the second probe holder and the connector holder cannot be moved to the testing positions since the stopper contacts portions of the retainer projecting from the rear surface of the connector in the connector holder. Thus, the electrical connection test cannot be conducted since the probes are not in contact with the terminal fittings of the connector. Thus an insufficiently inserted state of the retainer is detected. The stopper is in a position to block an insertion path of the connector into the connector holder when the second probe holder and the connector holder are in the testing positions. This prevents the leading ends of the probes from being damaged by forcible mounting of the connector into the connector holder.

According to a further preferred embodiment, a pair of probe holders is arranged to move toward and away from the opposite side surfaces of the connector holder.

Preferably, the relative movement mechanism comprises springs for biasing the probe holders toward the connector holder and toward testing positions where the probes are inserted through the testing holes of the connector in the connector holder.

The relative movement mechanism preferably comprises a cam that can be rotated or pivoted about one point as a fulcrum. The cam is formed with two pushing surfaces that project in substantially opposite directions with the fulcrum as a center. The cam is provided on one side wall of the connector holder, and the probe holders are formed with guide surfaces with which the corresponding pushing surfaces can come into contact, Rotation of the cam causes the pushing surfaces of the cam to push the guide surfaces of the probe holders. Thus, the probe holders move away from the connector holder, preferably against biasing forces of the springs, to retracted positions where the connector can be inserted at least partly into and taken out of the connector holder.

Operability of the above-described embodiment can be improved since the probe holders are moved to the testing positions by the biasing forces of the springs and to the retracted positions by the rotation of the cam when the connector is to be accommodated into the connector holder. Specifically, when the connector is to be accommodated into the connector holder, the guide surfaces of the probe holders are pushed by the pushing surfaces against the biasing forces of the springs as the cam is rotated, with the result that the probe holders are moved to the retracted positions away from the connector holder and the probes wait on standby at positions where they do not interfere with the connector that is being accommodated or taken out. After the connector is accommodated, a rotating force of the cam is released. Accordingly, the probe holders are moved toward the connector holder by the biasing forces of the springs, the leading ends of the probes are inserted into the testing holes of the connector through the probe insertion holes of the connector holder and are elastically brought into contact with the respective terminal fittings to conduct an electrical connection test. If the cam is rotated again after the electrical connection test, the probes are withdrawn from the testing holes of the connector. Thus, the connector can be taken out of the connector holder.

Preferably, the cam is secured to a lever pivotal about the fulcrum and is rotated or pivoted by a pivotal movement of the operable lever. With such an arrangement, the cam rotating operation for moving the probe holders to the retracted positions by the lever action can be manually performed without any difficulty.

According to the invention, there is further provided an electrical connection testing method for testing electrical connections of terminal fittings that are accommodated at least partly in a connector. The method comprises at least partly inserting a connector that has a connector housing with side walls. Testing holes are formed in side walls of the connector housing and extend at an angle different from 0° or 180°, and preferably substantially normal to a terminal mating direction of the terminal fittings with mating terminal fittings. The method then comprises inserting the connector into the connector holder formed with probe insertion holes that substantially correspond to the testing holes;

The method continues by relatively displacing a first probe holder, a second probe holder and/or the connector holder with respect to each other from a retracted position to a testing position so as to insert the probes into the probe insertion holes and the testing holes for contact with the terminal fittings of the held connector. The method then includes testing the terminals fittings in the connector by means of the probes.

The inventive electrical connection testing device and method can be applied suitably for female terminal fittings. In other words, the probes cannot be brought easily into contact with the female terminal fittings using the prior art electrical connection testing device. However, if the testing holes are formed in positions of the connector housing corresponding to portions of the female terminal fittings except barrel portions, the leading ends of the probes inserted through the testing holes can be brought securely and easily into contact with the side surfaces of the female terminal fittings.

These and other objects, features and advantages of the present invention will become apparent upon reading of the following detailed description of preferred embodiments and accompanying drawings. It should be understood that even though embodiments are separately described, single features thereof may be combined to additional embodiments.

DETAILED DESCRIPTION OF THE PREFERRED EMBODIMENTS

Figure 1:
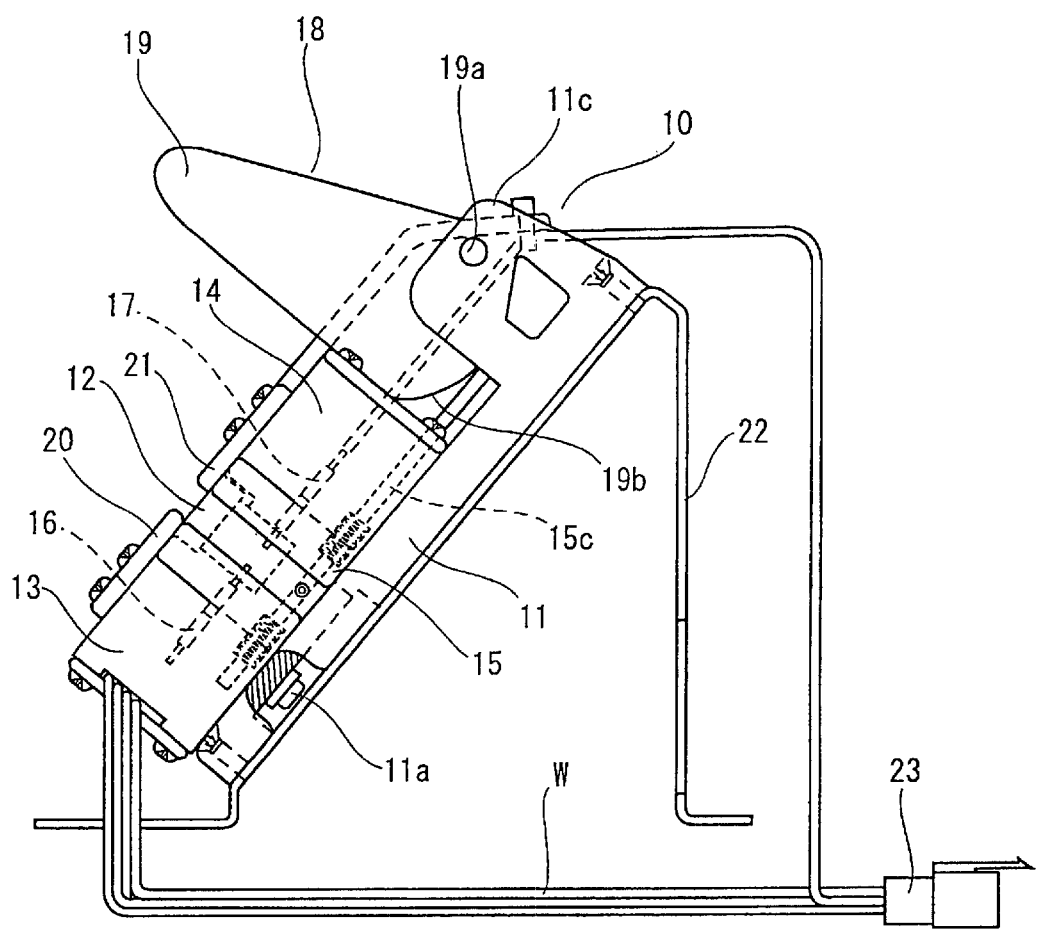
FIG. 1 is a front view of an electrical connection testing device for terminal fittings accommodated in a connector according to a first embodiment of the invention.

An electrical connection testing device in accordance with the invention is identified by the numeral 10 in FIGS. 1–7. The electrical testing device 10 has a base plate 11. A connector holder 12 is disposed on the base plate 11, and probe holders 13 and 14 are arranged on the base plate 11 to face the connector holder 12. The testing device 10 is designed for a connector C that has a connector housing Ca with side walls Cb. Electrical connection testing holes Cd are formed in the side walls Cb of the connector housing Ca and extending at an angle different from 0° or 180°, preferably substantially normal to a terminal fitting inserting direction (or mating direction of the illustrated terminal fitting T with an unillustrated mating terminal of a mating connector). Terminal fittings T are mounted in the connector housing Ca at two stages.

The first probe 13 is fixedly mounted at one end of the base 11 by a bolt 11a. The connector holder 12 and the second probe holder 14 have guide grooves 12f, 14f formed in their lower surfaces. The guide grooves 12f, 14f are engaged with a pair of rails 11b that project from the base 11 and extend in the longitudinal direction. Thus, the connector holder 12 and the second probe holder 14 can slide along the rails 11b (see FIGS. 3 and 4).

Figure 2:
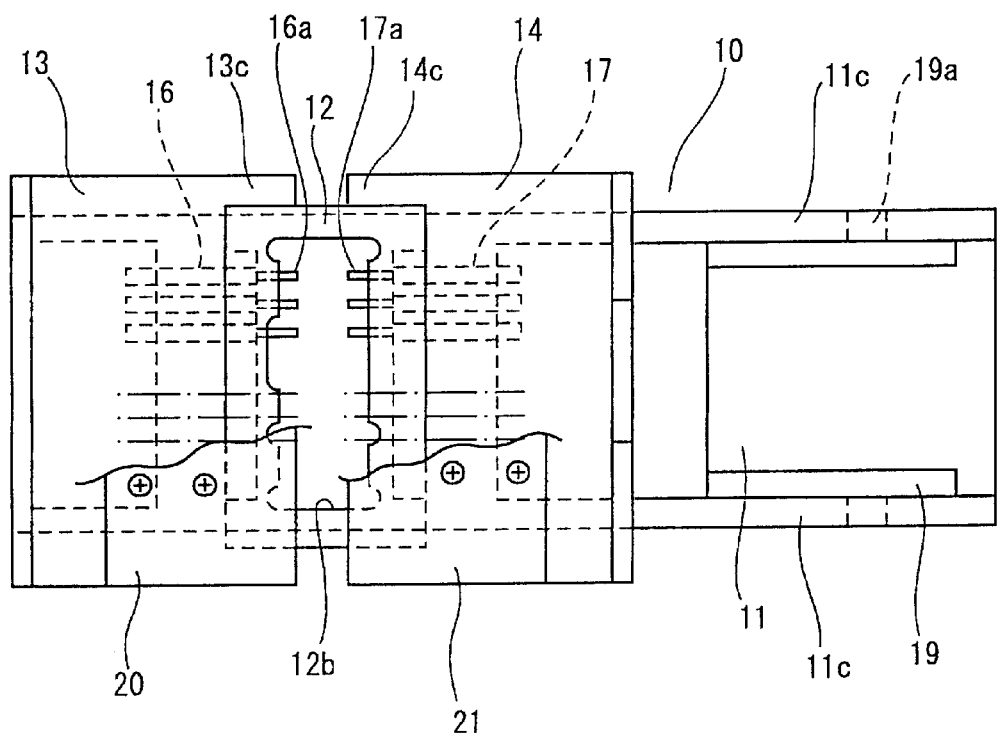
FIG. 2 is a plan view of the electrical connection testing device.
Figure 3:
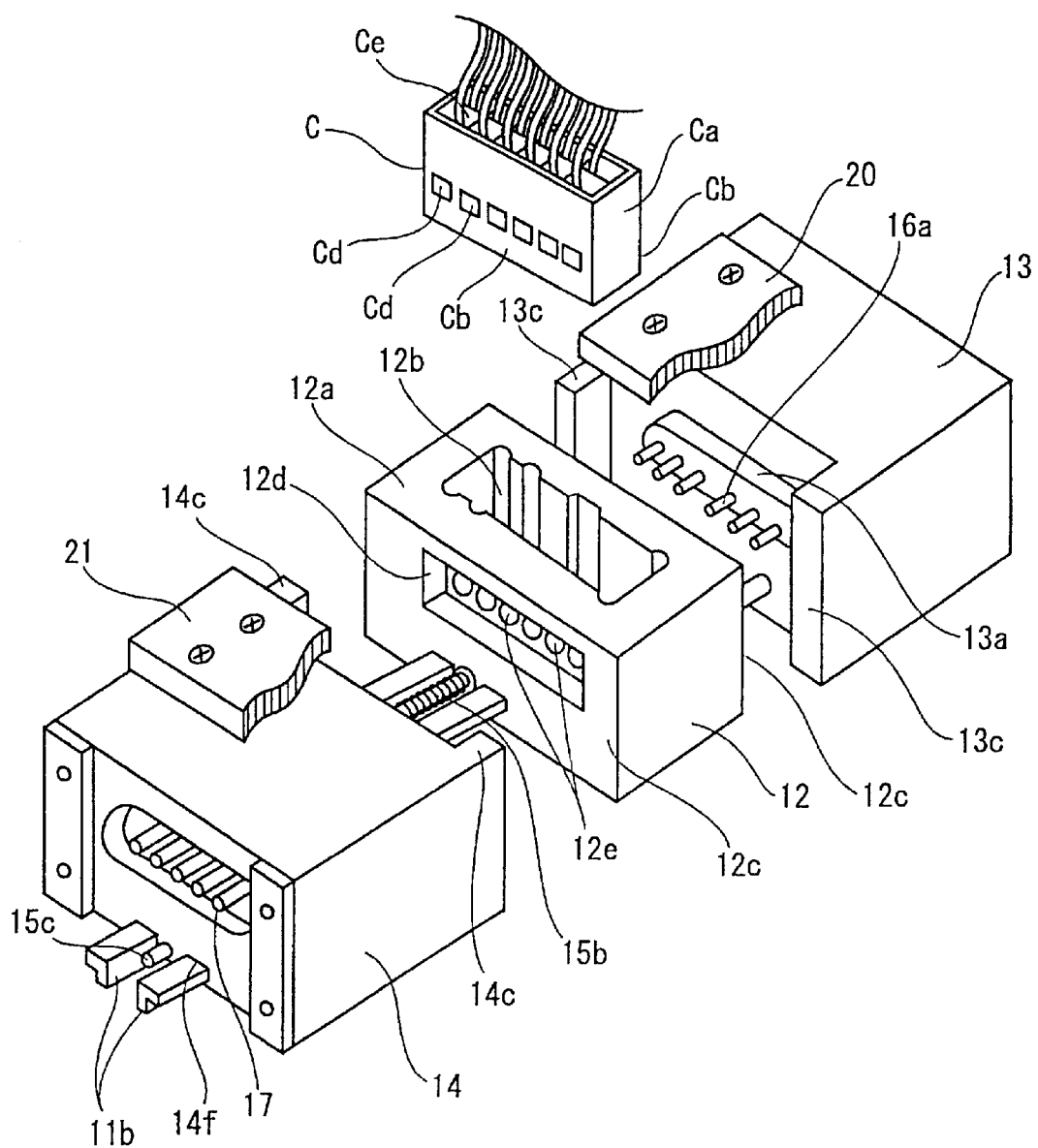
FIG. 3 is an exploded perspective view showing an essential portion of the electrical connection testing device.
Figure 4:
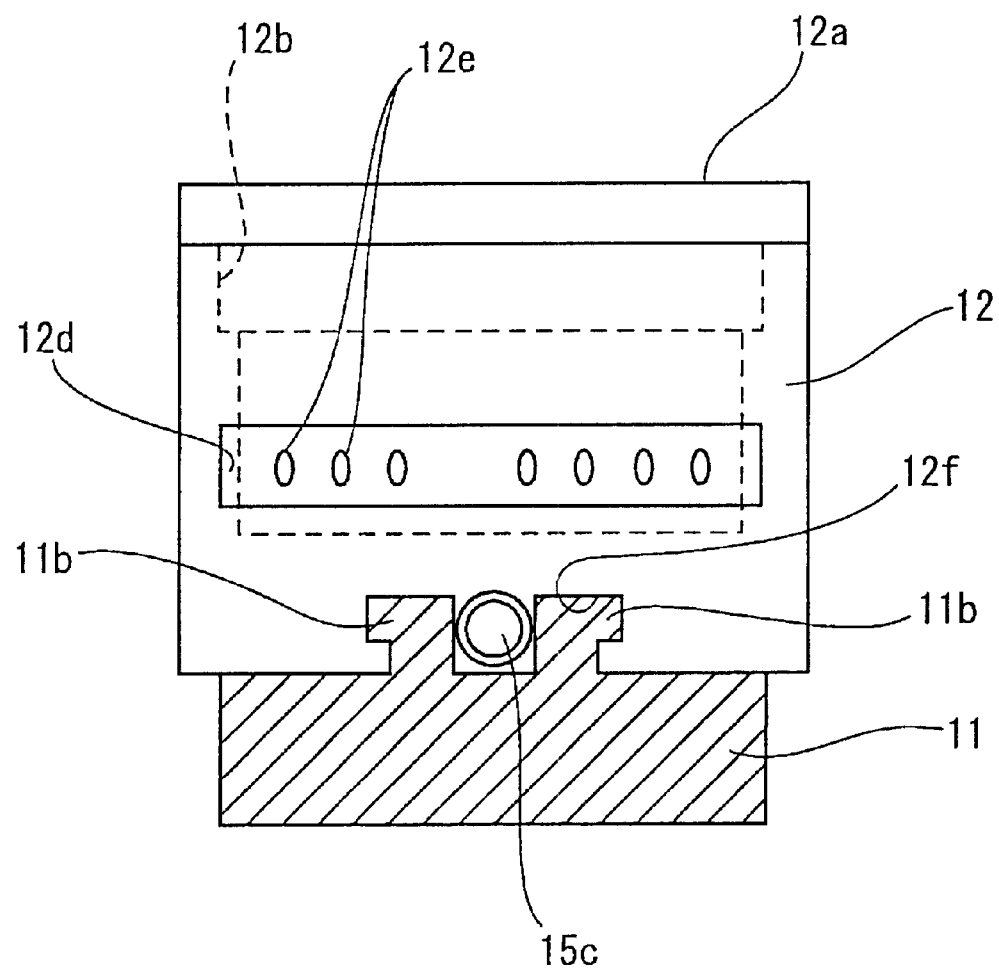
FIG. 4 is a side view of a connector holder.

The connector holder 12 has an upper surface 12a, and a connector accommodating portion 12b is formed in the upper surface 12a, as shown in FIGS. 2 and 3. The accommodating portion 12b is configured to conform substantially to the outer configuration of the connector C to be tested. Thus, the connector C can be fit at least partly in the connector accommodating portion 12. The connector C is fit into the accommodating portion 12b of the connector holder 12 from above, as shown in FIG. 6(B), such that a surface of the connector C through which terminal fittings are inserted faces up. Additionally, the connector C is aligned such that the side walls Cb that have the testing holes Cd face the first and second probe holders 13, 14. Side wall portions 12c at the opposite sides of the connector holder 12 have recesses 12d and probe insertion holes 12e are formed at the bottoms of the respective recesses 12d to communicate with the testing holes Cd of the connector C.

Figure 6A:
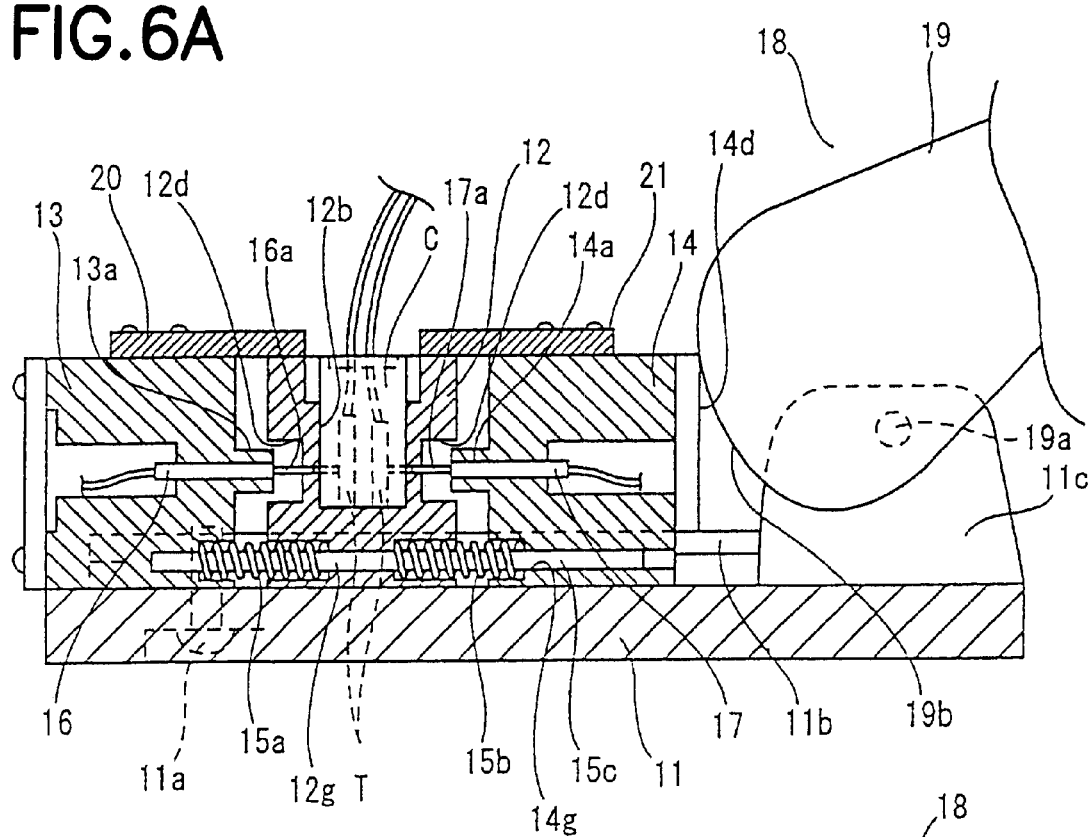
FIGS. 6A and 6B are sections of the connector holder in its retracted position and testing position, respectively.
Figure 6B:
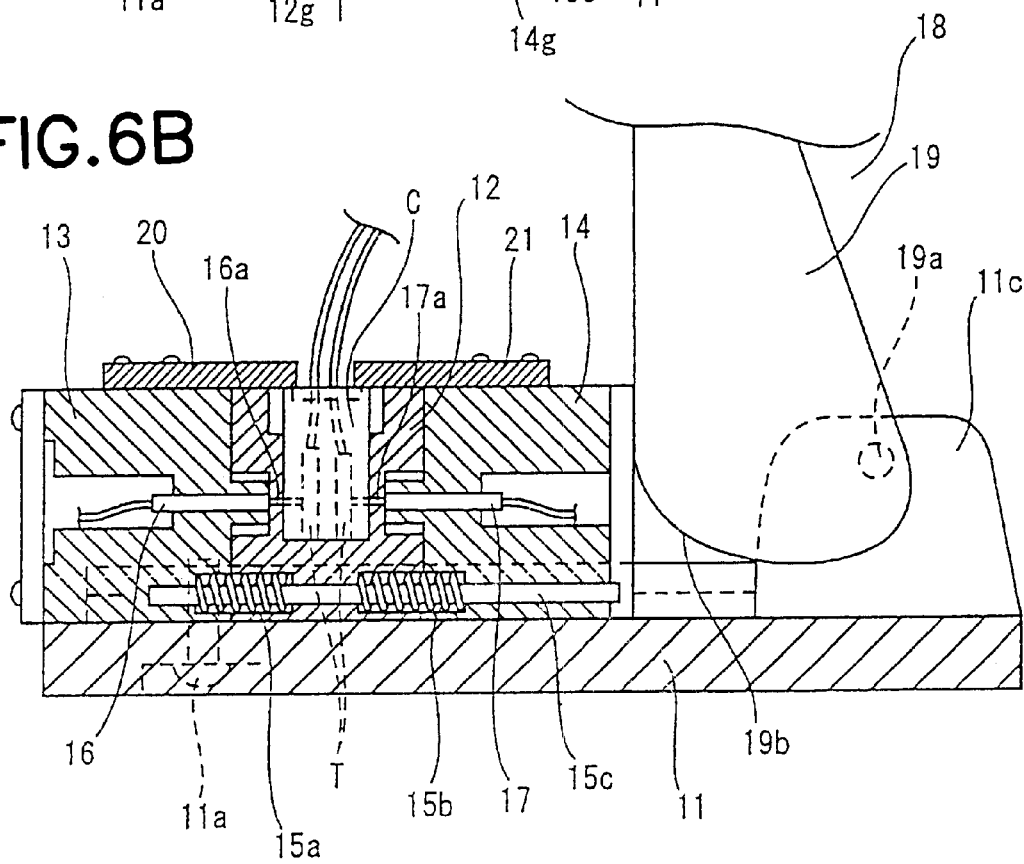

As shown in FIG. 6(A), a slide shaft 15c has one end fixed to a bottom portion of the first probe holder 13. Remaining portions of the slide shaft 15c pass through guide holes 12g, 14g of the connector holder 12 and the second probe holder 14, respectively. A spring 15a is mounted on the slide shaft 15c between the first probe holder 13 and the connector holder 12 and a second spring 15b is mounted on the slide shaft 15c between the connector holder 12 and the second probe holder 14. The springs 15a, 15b form a retraction linking mechanism 15, and the first and second probe holders 13, 14 are moved forcibly away from the connector holder 12 to retracted positions (see FIG. 6(A)) by the biasing forces of the springs 15a, 15b.

Projections 13a, 14a project from the surfaces of the first and second probe holders 13, 14 that face the connector holder 12. The projections 13a, 14a are configured for engagement in the recesses 12d in the connector holder 12. Probes 16, 17 are mounted through the projections 13a, 14a at substantially the same intervals as the testing holes Cd of the connector C to be tested. Contact elements 16a, 17a project at the leading ends of the probes 16, 17 and can be inserted elastically through the probe insertion holes 12e and into the testing holes Cd. The contact elements 16a, 17a are provided in the probes 16, 17 for telescopic retraction retracting into a body of the respective probes 16, 17 when their leading ends contact the corresponding terminal fittings T in the connector C. The connector holder 12 and the second probe holder 14 can be moved toward the first probe holder 13 and into testing positions so that the contact elements 16a, 17a inserted into the testing holes Cd are brought elastically into contact with the terminal fittings T of the connector C, as shown in FIG. 6(B). The facing surfaces of the first probe holder 13, the connector holder 12 and the second probe holder 14 are in contact with each other when the contact holder 12 and the second probe holder 14 are in the testing positions. Additionally, jaw portions 13c, 14c project at the opposite sides of the first and second probe holders 13, 14 and can be fit or slid on the outer surfaces of the opposite sides of the connector holder 12 for positioning.

A pushing mechanism 18 is provided at the end of the base portion 11 adjacent to the second probe holder 14 for pushing a receiving surface 14d of the second probe holder 14 at substantially the opposite side from the connector holder 12. The pushing mechanism 18 is comprised of a lever 19 pivotally mounted about a pin 19a that is inserted through bearings 11c projecting at the front and rear sides at the other end of the base portion 11, and a cam portion 19b which can be pressed against the receiving surface 14d by the pivotal movement of the lever 19.

Plate-shaped stoppers 20, 21 are provided on the upper surfaces of the first and second probe holders 13, 14 such that the end surfaces of the stoppers 20, 21 project toward the accommodating portion 12b. The stoppers 20, 21 are adapted to prevent the connector C from coming out by facing the terminal inserting surface of the connector C in the accommodating portion 12b and to detect an insufficiently inserted state of a retainer Ce mounted from the side of the terminal inserting surface for doubly locking the terminal fittings T by interfering with the retainer Ce.

Mount fittings 22 are fixed to the base plate 11 to secure the base portion 11 to a work table, and connectors 23, 24 for are mounted at ends of wires W connected with the respective probes 16, 17 for connection with a testing apparatus.

Figure 5:
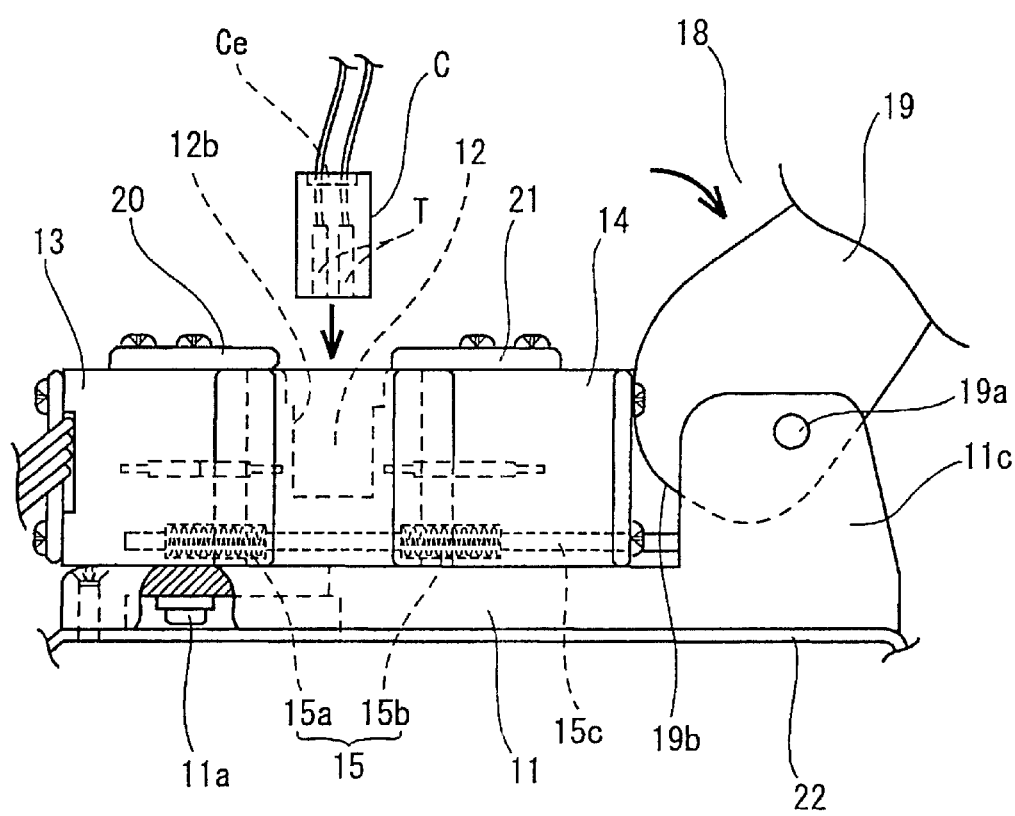
FIG. 5 is a front view of the connector holder in its retracted position.

First, as shown in FIG. 5, the lever 19 is pivoted away from the second probe holder 14. As a result, the first and second probe holders 13, 14 are at the retracted positions and are spaced from the connector holder 12 by a specified distance. The connector holder 12 and the first and second probe holders 13, 14 preferably are positioned in the retracted positions at least partly by the biasing forces of the springs 15a, 15b of the retraction linking mechanism 15. In this state, the stoppers 20, 21 also are retracted to open the entrance of the accommodating portion 12b of the connector holder 12. Consequently, the connector C can be fit into the accommodating portion 12b, as shown in FIG. 6A. However, the first and second probe holders 13, 14 may be connected to the lever 19, and hence may be moved to their retracted positions directly by the movement of the lever 19.

Figure 7:
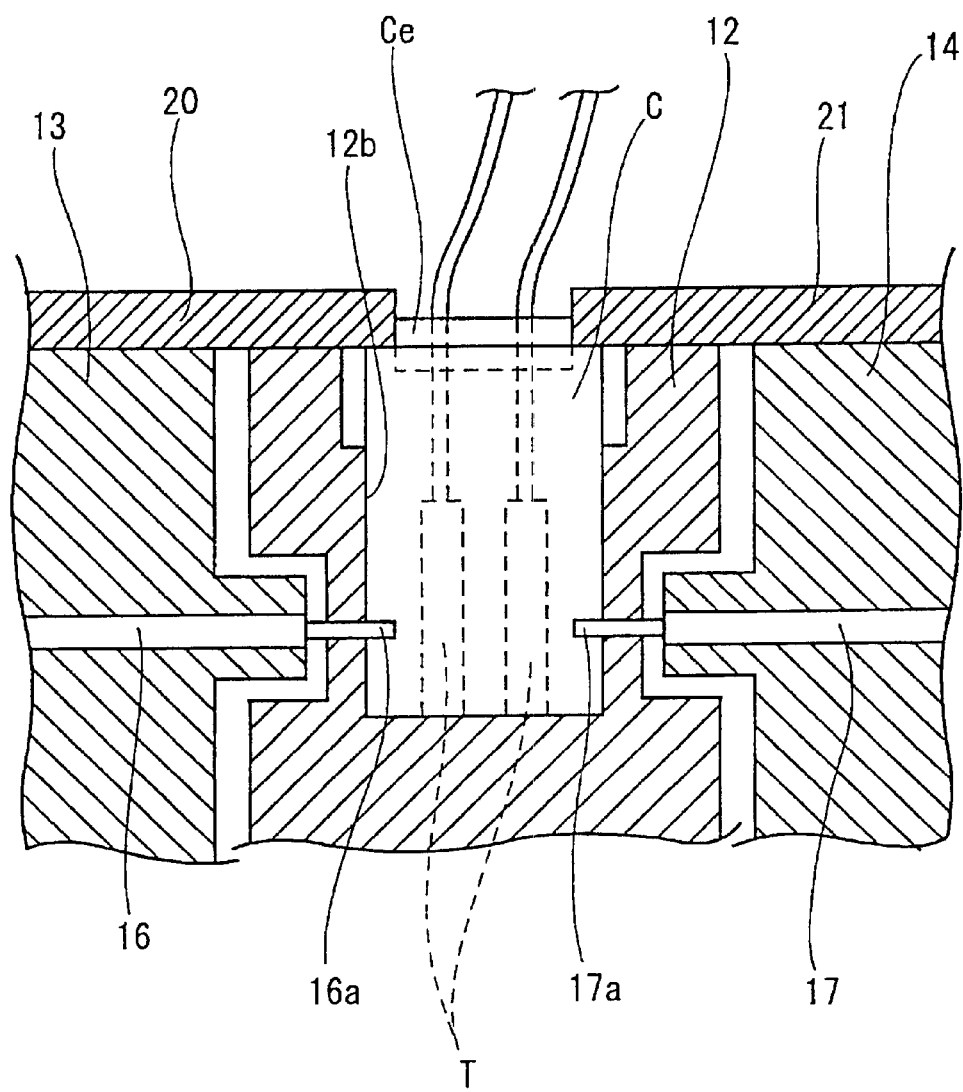
FIG. 7 is a section showing a state where a retainer is insufficiently inserted into a connector.

Subsequently, as shown in FIG. 6B, the lever 19 is pivoted toward the second probe holder 14 and into a substantially standing position. As a result, the second probe holder 14 is pushed toward the connector holder 12 by the action of the cam 19b, and the connector holder 12 is pushed together with the second probe holder 14 toward the first probe holder 13. The stoppers 20, 21 will contact a retainer Ce of the connector C that is inserted insufficiently and that projects from the end surface of the connector C. Thus, as shown in FIG. 7, the contact between the stoppers 20, 21 and the retainer Ce prevent the second probe holder 14 and the connector holder 12 from reaching the testing positions. The connector C fails the electrical connection test in this situation because the contact elements 16a, 17a of the probes 16, 17 do not contact the terminal fittings T in this state.

On the other hand, if the retainer Ce is inserted completely and correctly, the stoppers 20, 21 reach positions to abut the terminal inserting surface of the connector C, as shown in FIG. 6(B). Accordingly, the stoppers 20, 21 prevent the connector C from coming out of the accommodating portion 12b of the connector holder 12. At this stage, the contact elements 16a, 17a at the leading ends of the respective probes 16, 17 are brought into contact with the respective terminal fittings T through the corresponding probe insertion holes 12e and testing holes Cd. Connection signals are outputted, and a testing apparatus or circuit detects whether or not the terminal fittings T are arrayed properly. If the lever 19 is pivoted again to reach the inclined state (see FIG. 6A) after the completion of the electrical connection test, the connector holder 12 and the second probe holder 14 are moved back to the retracted positions, preferably by the biasing forces of the springs 15a, 15b, and the connector C can be taken out of the accommodating portion 12b.

Figure 8A:
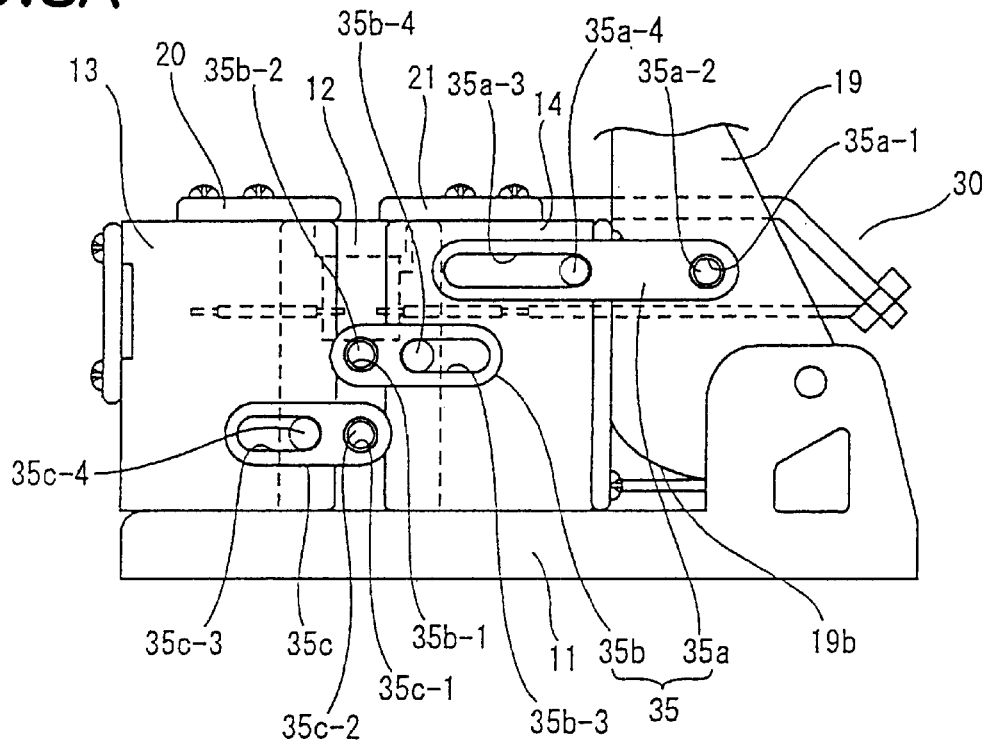
FIGS. 8A and 8B are front views of an electrical connection testing device according to a second embodiment in testing and retracted positions, respectively.
Figure 8B:
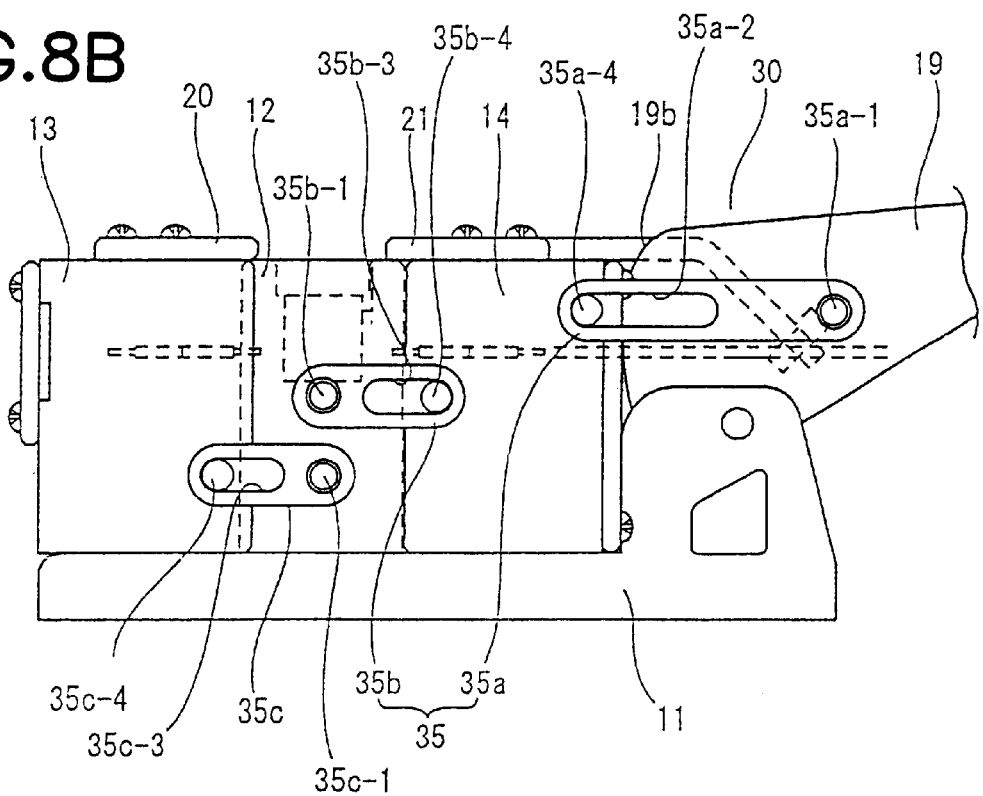
Figure 9:
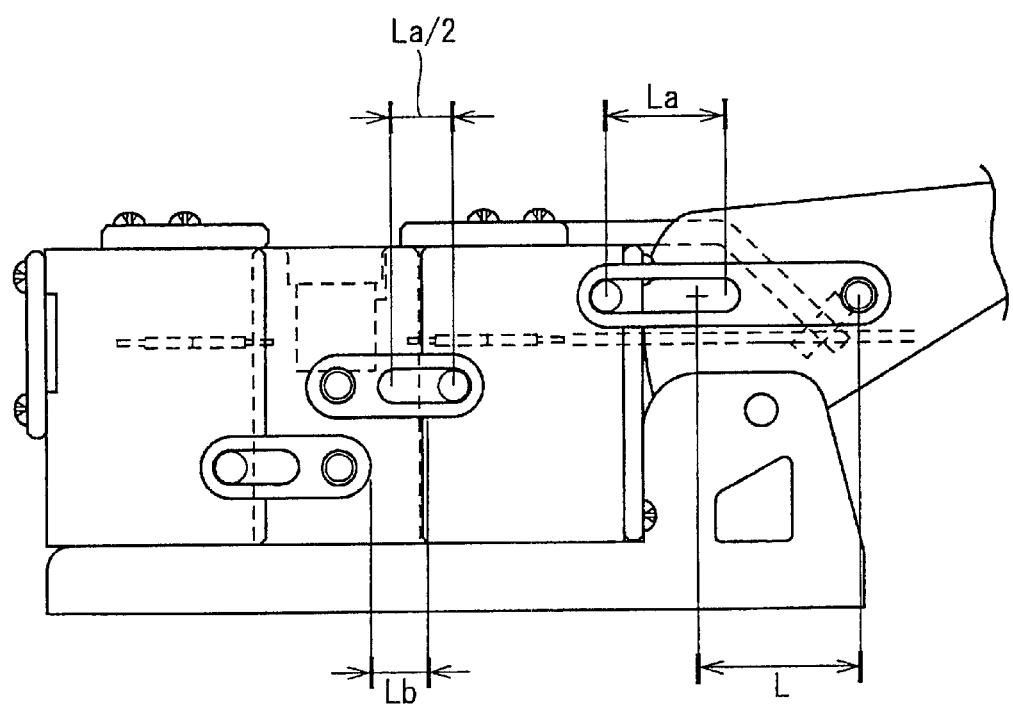
FIG. 9 is a diagram showing a dimensional relationship of oblong holes of first and second links.
Figure 10:
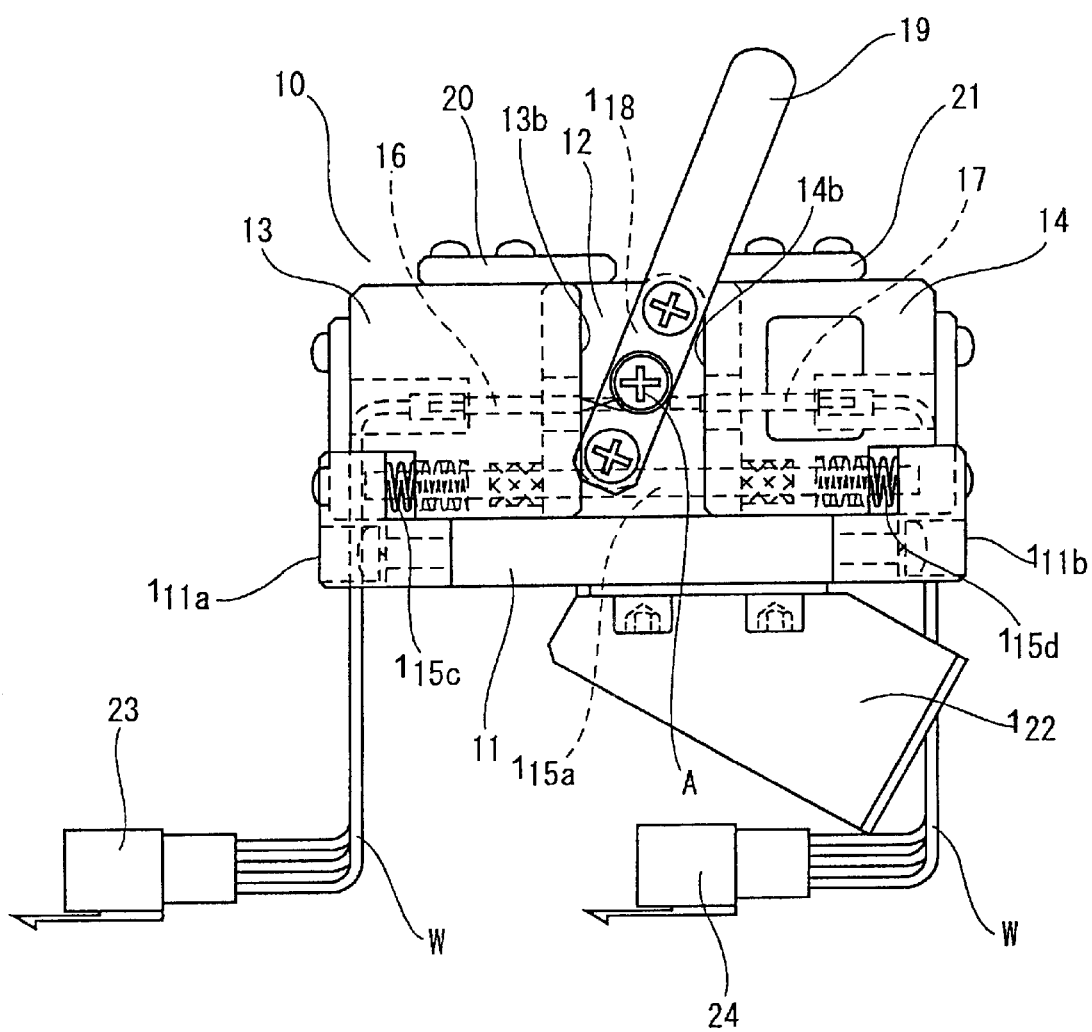
FIG. 10 is a front view of an electrical connection testing device for terminal fittings accommodated in a connector according to one embodiment of the invention.
Figure 11:
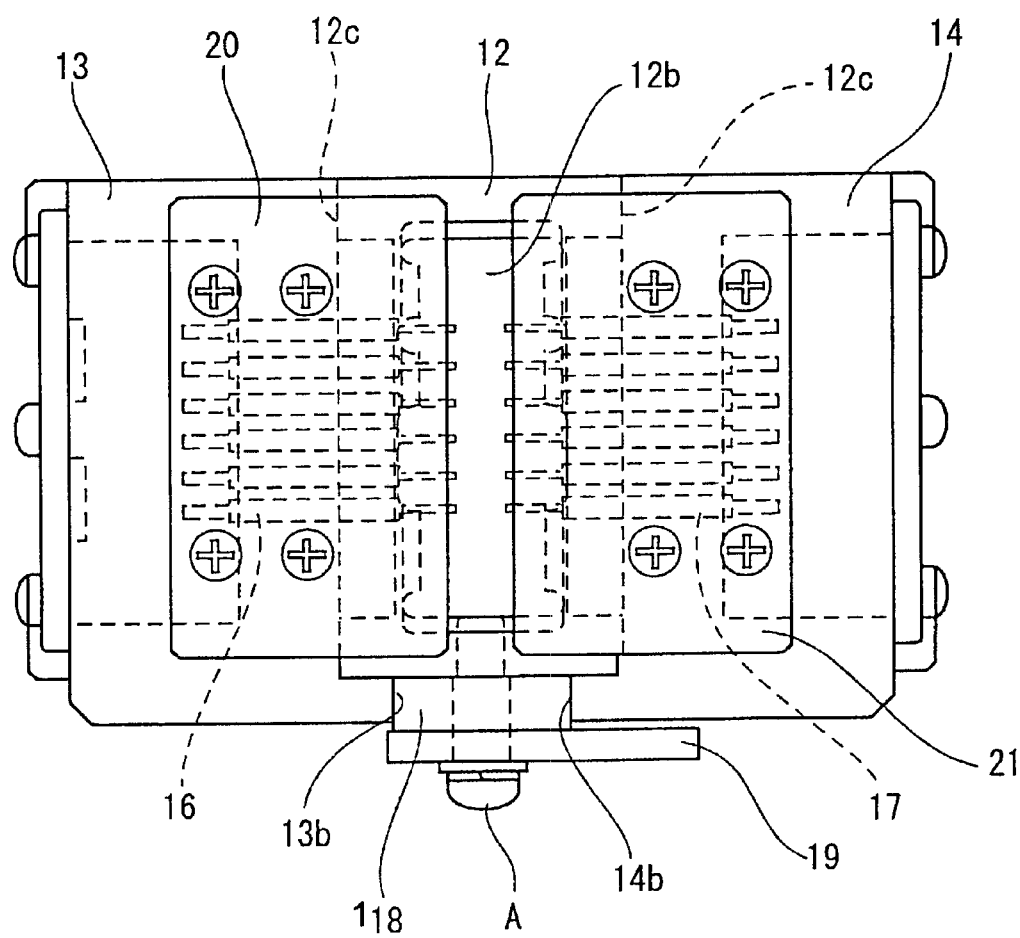
FIG. 11 is a plan view of the electrical connection testing device.

FIGS. 8A and 8B show an electrical connection testing device 30 according to a second embodiment, and having a retraction linking mechanism 35 different from that of the first embodiment. The retraction linking mechanism 35 is formed by first and second links 35a, 35b. The first and second links 35a, 35b are provided between the operable lever 19 and the second probe holder 14 and between the second probe holder 14 and the connector holder 12 to extend over side surfaces preferably at least at one side. Although not directly relating to the retraction linking mechanism 35, a third link 35c is provided for restricting the retracted position of the connector holder 12 between the connector holder 12 and the first probe holder 13.

The first, second and third links 35a, 35b, 35c are mounted on the operable lever 19 and the connector holder 12 by inserting mount pins 35a-2, 35b-2, 35c-2 through mount holes 35a-1, 35b-1, 35c-1 formed at ends of the respective links 35a, 35b, 35c. Oblong holes 35a-3, 35b-3, 35c-3 extend in a longitudinal direction at the ends of the first, second and third links 35a, 35b, 35c opposite the mount holes 35a-1. 35b-1, 35c-1, and slidable pins 35a-4, 35b-4, 35c-4 driven into the second probe holder 14 and the first probe holder 13 are slidably fitted into the oblong holes 35a-3, 35b-3, 35c-3.

Length La of the oblong hole 35a-3 of the first link 35a is set at a dimension (La=L−Lb) obtained by subtracting a specified moving distance Lb of the second probe holder 14 from the retracted position to the testing position from a specified moving distance L of the mount pin 35a-2 according to the pivotal movement of the operable lever 19. On the other hand, the length of the oblong holes 35b-3, 35c-3 of the second and third links 35b, 35c are set at half the length of the oblong hole 35a-3, i.e. La/2. The construction of the second embodiment other than the linking mechanism 35 is similar to or the same as that of the first embodiment, and corresponding elements are no identified by the same reference numerals.

FIG. 8(A) shows a state where the connector holder 12 and the second probe holder 14 are at the testing positions. In this state, the respective slidable pins 35a-4, 35b-4, 35c-4 are in the oblong holes 35a-3, 35b-3, 35c-3. As shown in FIG. 8(B), the operable lever 19 is pivoted to be inclined, and the slidable pin 35a-4 contacts the outer end of the oblong hole 35a-3 of the first link 35a to move the second probe holder 14 forcibly to the retracted position. Accordingly, the slidable pin 35b-4 contacts the outer end of the oblong hole 35b-3 of the second link 35b to move the connector holder 12 forcibly to the retracted position. Further, the third link 35c contacts the outer end of the oblong hole 35c-3 when the connector holder 12 reaches the retracted position, thereby functioning as a stopper for preventing the connector holder 12 from being retracted beyond the retracted position.

As is clear from the above description, the inventive electrical connection testing device can easily and securely test the connectors which have been conventionally difficult to test and is also applicable for connectors in which the terminal fittings are mounted at two stages. The connector holder has stoppers for interfering with the retainer when the retainer is inserted insufficiently inserted on the terminal inserting surface of the connector. Thus, the mounted state of the retainer can be detected prior to the electrical connection test.

FIGS. 10 to 16 show an electrical connection testing device 100 according to a further embodiment. The testing device 100 is constructed such that probe holders 13, 14 are arranged on a base plate 11 to substantially face a connector holder 12. The testing device 100 is designed for a connector C in which terminal fittings T are mounted in two stages, and in which electrical connection testing holes Cd are formed in side walls Cb of a connector housing Ca extending in a direction at an angle different from 0° or 180°, preferably substantially normal to a terminal fitting inserting direction.

Figure 13:
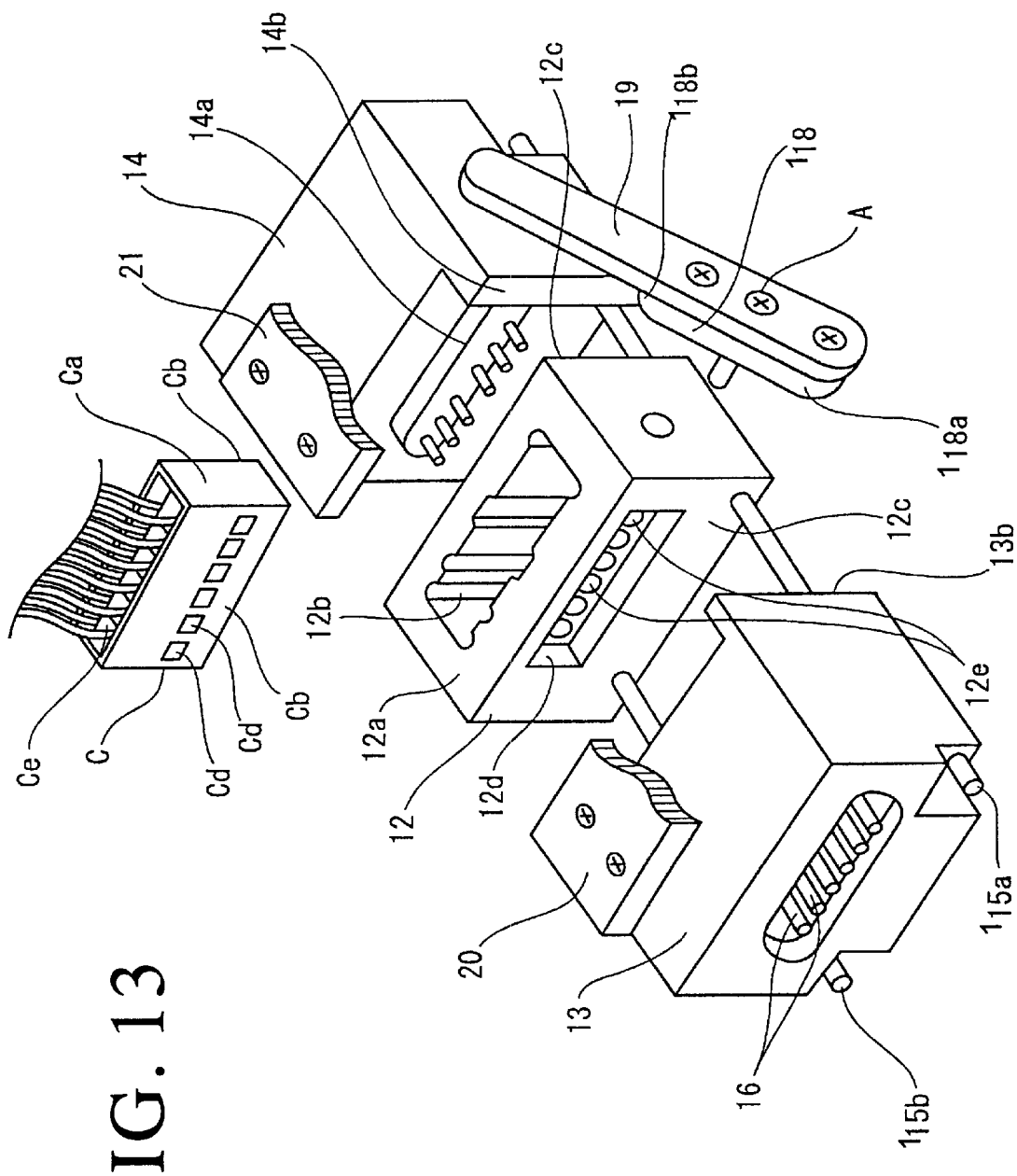
FIG. 13 is an exploded perspective view showing an essential portion of the electrical connection testing device.
Figure 15A:
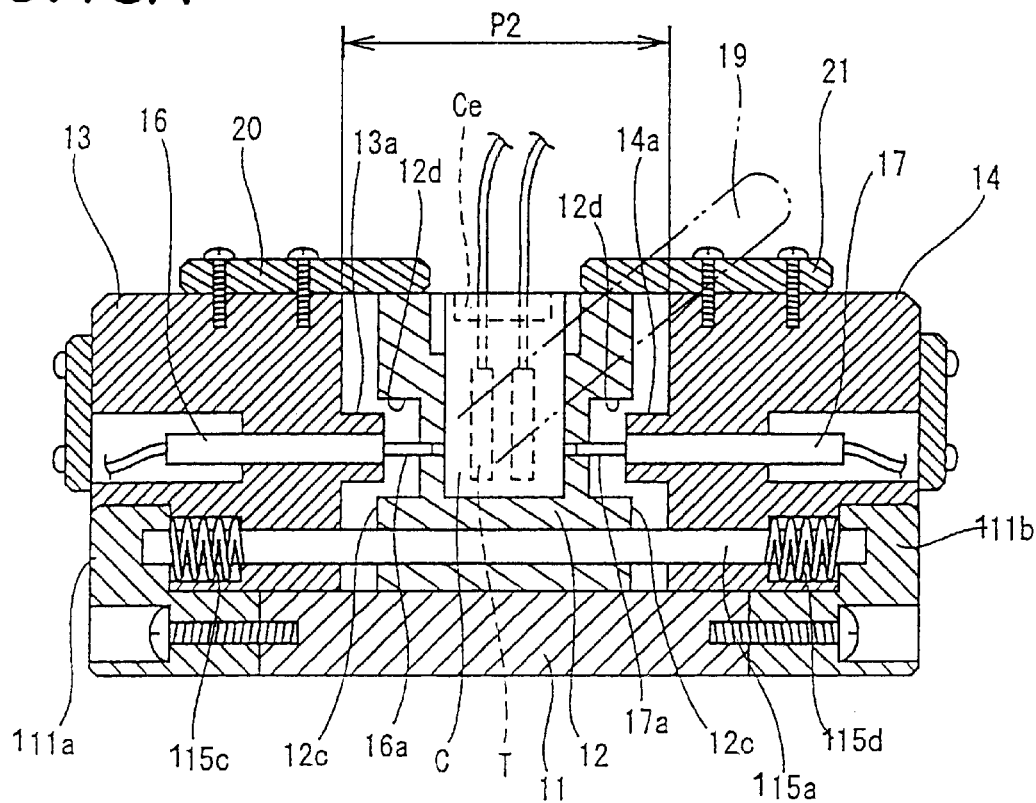
FIG. 15(A) is a section of the electrical connection testing device when the connector holders are in their retracted positions.

The connector holder 12 is secured in the middle of the base plate 11, and a connector accommodating portion 12b is formed in an upper surface 12a as shown in FIG. 13. The configuration of the accommodating portion 12b is the substantially same as the outer configuration of the connector C to be tested so that the connector C can be inserted or fitted at least partly in the connector accommodating portion 12b of the connector holder 12 from above, as shown in FIG. 15(A). The connector C is held such that a surface of the connector C through which terminal fittings are inserted is faced up, and such that the side walls Cb with the testing holes Cd substantially face the probe holders 13, 14. Further, side wall portions 12c at the opposite sides of the connector holder 12 are formed with recesses 12d to substantially face the respective testing holes Cd of the connector C in the connector holder 12. Probe insertion holes 12e are formed in the recesses 12d and communicate with the testing holes Cd at the bottoms of the respective recesses 12d.

Figure 12:
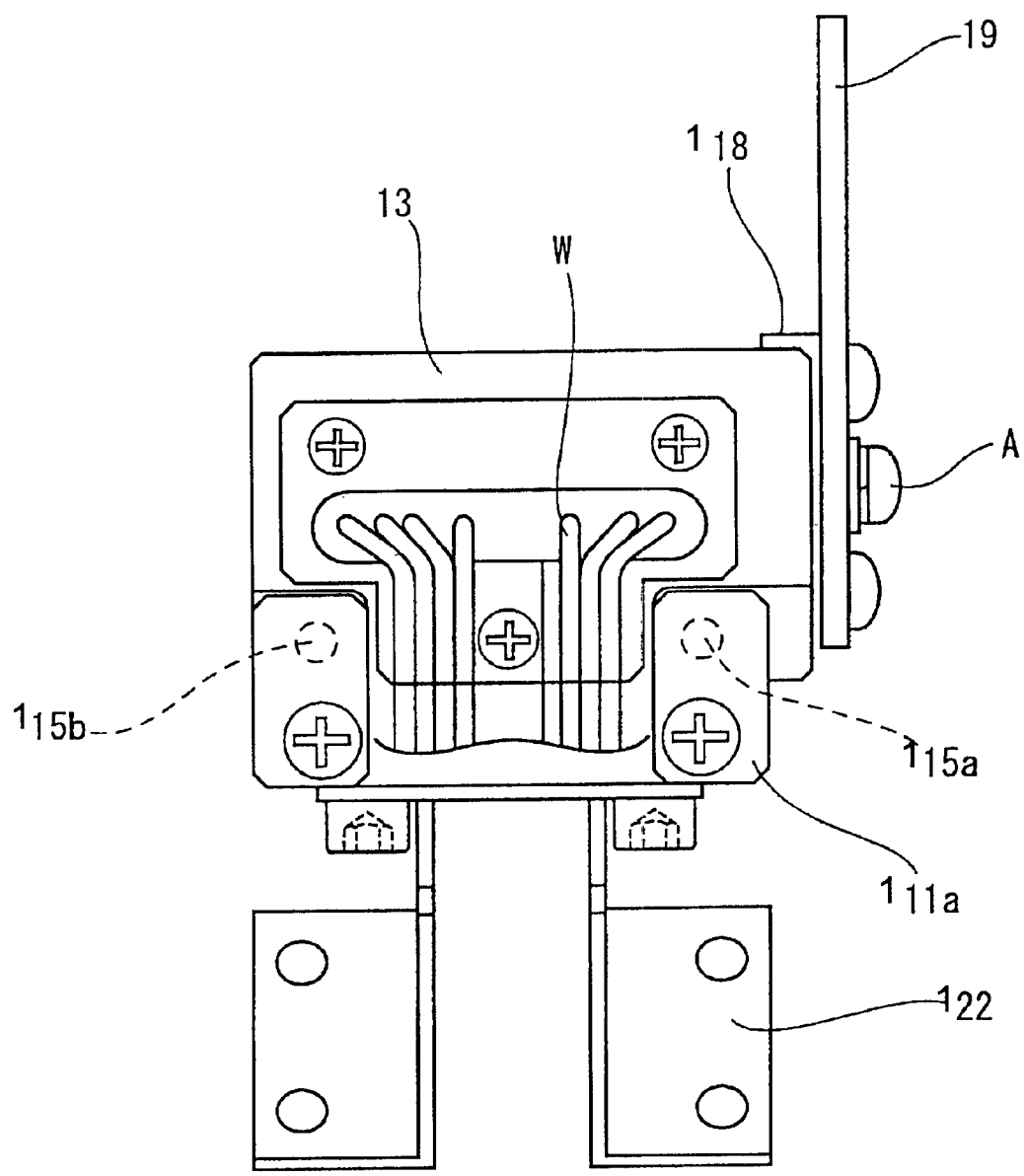
FIG. 12 is a side view of the electrical connection testing device.

Two probe holders 13, 14 are provided on the base plate 11 and face the opposite side walls 12c of the connector holder 12. As shown in FIGS. 12 and 13, slide shafts 115a, 115b are inserted through bottom portions of the connector holder 12 and the probe holders 13, 14, and the opposite ends of the slide shafts 115a, 115b are supported by receiving plates 111a, 111b mounted on the opposite end surfaces of the connector holder 12. Thus, the probe holders 13,14 are movable toward and away from the opposite side surfaces of the connector holder 12. Further, springs 15c, 15d are mounted on the slide shafts 115a, 115b and are in a compressed state between the facing surfaces of the receiving plates 111a, 111b and the probe holders 13, 14. The springs 15c, 15d bias the respective probe holders 13, 14 toward testing positions P1 where the probe holders 13, 14 are substantially in contact with opposite side surfaces of the connector holder 12.

Projections 13a, 14a are formed on the surfaces of the probe holders 13, 14 that face the connector holder 12, and are configured for engagement in the recesses 12d. Probes 16, 17 are mounted through the projections 13a, 14a and extend along directions toward and away from the probe holders 13, 14. A plurality of probes 16, 17 are mounted at substantially the same intervals as the testing holes Cd of the connector C to be tested, such that elastically projecting contact elements 16a, 17a at the leading ends of the probes 16, 17 can be inserted through the probe insertion holes 12e and into the testing holes Cd.

A cam 118 is provided on one of the front and rear surfaces of the connector holder 12 that does not face the probe holders 13, 14, and can be rotated about a fulcrum A. As shown in FIG. 13, the cam 118 has a pair of pushing surfaces 118a, 118b that project toward opposite sides. Guide surfaces 13b, 14b project from the probe holders 13, 14 and can be contacted by the pushing surfaces 118a, 118b. The pushing surfaces 118a, 118b push the guide surfaces 13b, 14b as the cam 118 is rotated to move the probe holders 13, 14 together to retracted positions P2 spaced away from the connector holder 12.

The cam 118 is secured to the bottom end of an operable lever 19 that is pivotal about the fulcrum A, and hence the cam 118 can be rotated via a lever mechanism by the operable lever 19. The cam 118 can forcibly move the probe holders 13, 14 away from each other against the biasing forces of the springs 15c, 15d regardless of whether the cam 118 is rotated toward the probe holder 13 or toward the probe holder 14.

Plate-shaped stoppers 20, 21 are provided on the upper surfaces of the probe holders 13, 14 such that the end surfaces of the stoppers 20, 21 project toward the accommodating portion 12b. The stoppers 20, 21 face the terminal inserting surface of the connector C in the accommodating portion 12b and thus prevent the connector C from coming out. Additionally, the stoppers 20, 21 interfere with an insufficiently inserted retainer Ce mounted from the side of the terminal inserting surface for doubly locking the terminal fittings T. This interference with the retainer Ce detects an insufficiently inserted state of the retainer Ce.

Mount fittings 122 are fixed to the base plate 11 to secure the base plate 11 to a work table, and connectors 23, 24 for the connection with a testing apparatus are mounted at ends of wires W connected with the respective probes 16, 17.

Figure 14:
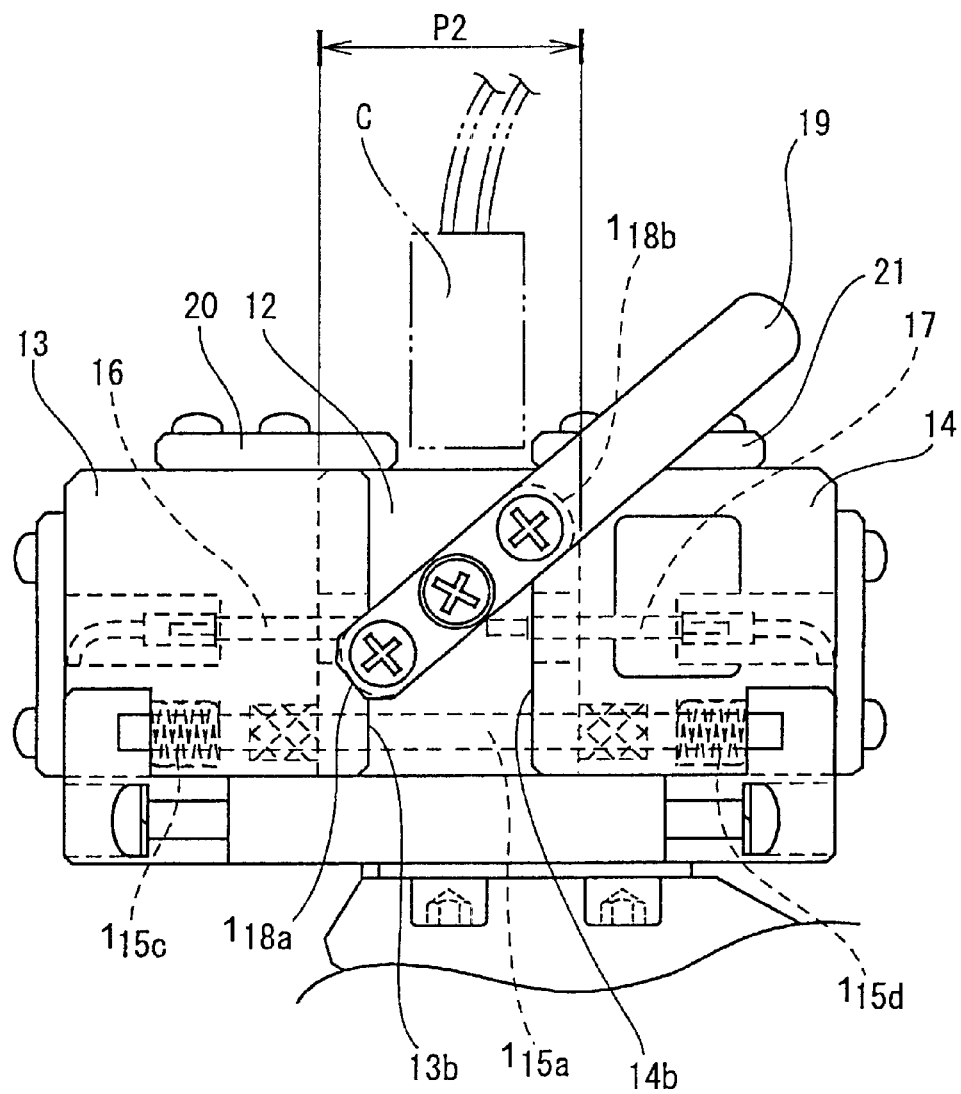
FIG. 14 is a front view showing retracted positions of connector holders.

Electrical connection is tested using the electrical connection testing device 100 by manually pivoting the lever 19, as shown in FIG. 14. Thus, the pushing surfaces 118a, 118b of the cam 118 push the guide surfaces 13b, 14b of the probe holders 13, 14, with the result that the probe holders 13, 14 are moved to the retracted positions P2 away from each other. At this time, the stoppers 20, 21 also are moved to open the entrance of the accommodating portion 12b of the connector holder 12. Accordingly, the connector C can be fit at least partly into the accommodating portion 12b of the connector holder 12, as shown in FIG. 15(A).

Subsequently, if the pivoted lever 19 is released, the probe holders 13, 14 are moved by the biasing force of the springs 15c, 15d to the testing positions P1 shown in FIG. 15(B) where the probe holders 13, 14 are in contact with the connector holder 12. At this time, the stoppers 20, 21 will contact the retainer Ce of the connector C if the retainer Ce is inserted insufficiently and projects from the end surface of the accommodating portion 12b, as shown in FIG. 16. Thus, the probe holders 13, 14 cannot reach the testing positions P1, and the connector C fails the electrical connection test because the contact elements 16a, 17a of the probes 16, 17 do not contact the terminal fittings T in this state.

Figure 15B:
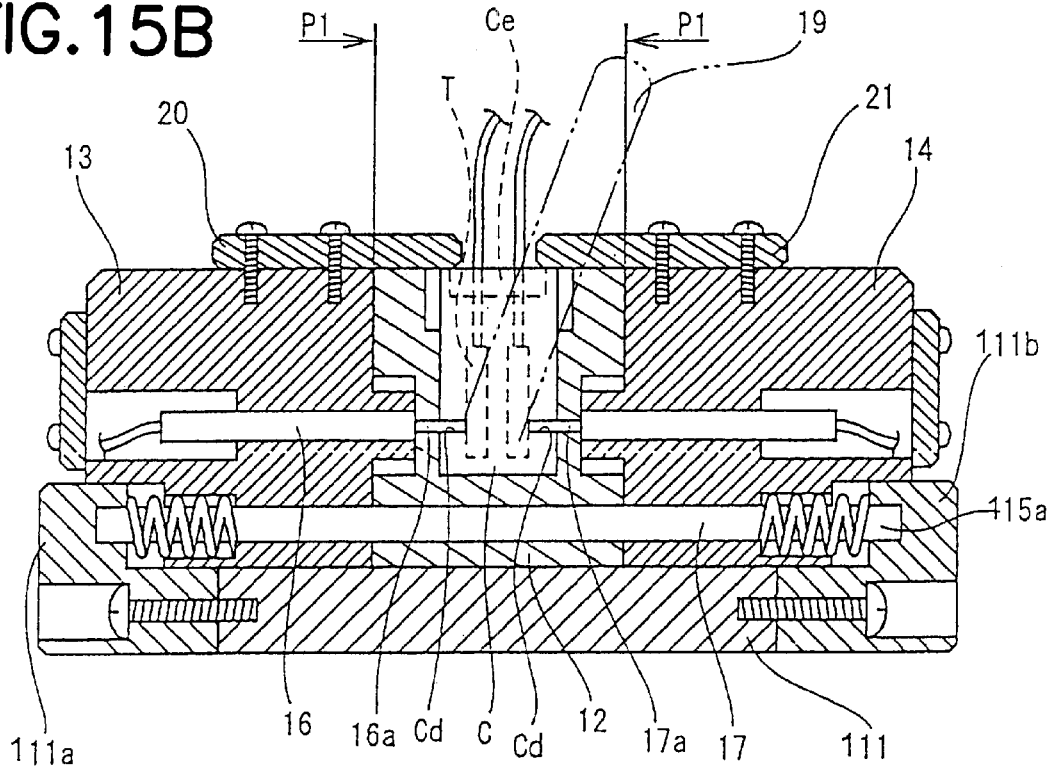
FIG. 15(B) is a section of the electrical connection testing device when the connector holders are in their testing positions.
Figure 16:
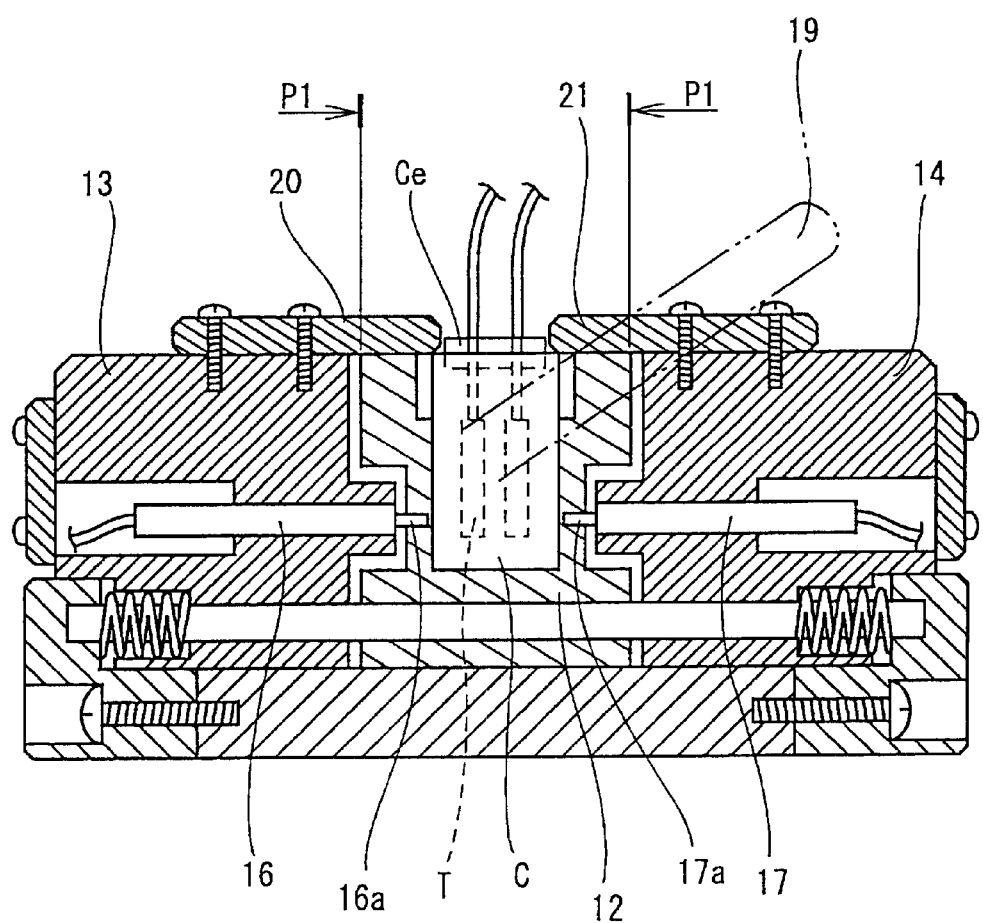
FIG. 16 is a section showing a mounted state of the connector having the retainer insufficiently inserted.
Figure 17:
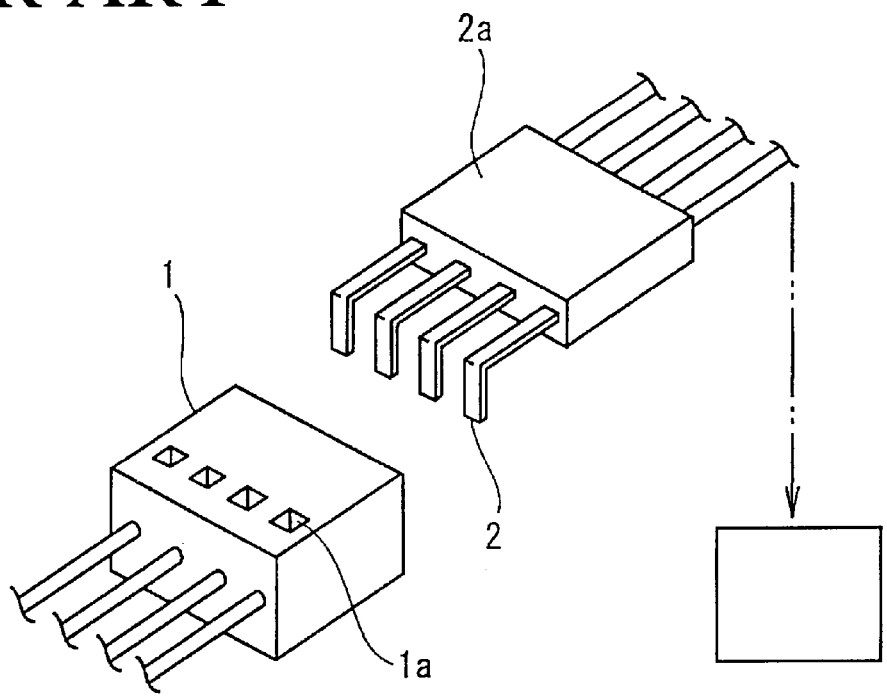
FIG. 17 is a schematic view showing a prior art electrical connection test.

On the other hand, if the retainer Ce is inserted completely, the stoppers 20, 21 can reach positions to face the opposite ends of the terminal inserting surface of the connector C, as shown in FIG. 15(B) and prevent the connector C from coming out. At this stage, the contact elements 16a, 17a at the leading ends of the respective probes 16, 17 are brought into contact with the respective terminal fittings T through the corresponding probe insertion holes 12e and testing holes Cd. Connection signals are outputted, and the testing apparatus detects whether or not the terminal fittings T are properly arrayed or inserted or positioned. After completion of the electrical connection test, the lever 19 is pivoted again to move the probe holders 13, 14 to the retracted positions P2, and the connector C can be taken out of the accommodating portion 12b.

The present invention is not limited to the foregoing embodiment. For example, a locking means, such as a locking claw, may be provided between the lever 19 and the connector holder 12 or the base plate 11 for locking the lever 19 in an alignment where the probe holders 13, 14 are in the retracted positions P2. Thus, the connector C can be placed in the connector holder 12 without holding the lever 19 in its pivoted state. The probe holders 13, 14 then can be moved to the testing positions P1 by the biasing forces of the springs 15c, 15d by releasing locking of the lever 19. Additionally, the stoppers 20, 21 for detecting an insufficient insertion of the retainer may be provided on only either one of the probe holders 13, 14.

As is clear from the above description, the inventive electrical connection testing device and method can easily and securely test the connectors which have been conventionally difficult to test and is also applicable for connectors with terminal fittings mounted at two stages. Since the connector holder is provided with the stoppers for interfering with the retainer when the retainer inserted insufficiently on the terminal inserting surface of the connector, the mounted state of the retainer can be detected prior to the electrical connection test.

What is claimed is:

1. An electrical connection testing device (10; 30; 100) for testing electrical connections of terminal fittings (T) at least partly accommodated in a connector (C) by at least partly inserting testing probes (16; 17) through testing holes (Ce) formed in side walls (Cb) of a connector housing (Ca), so that the testing probes (16, 17) can contact with side surfaces of the terminal fittings (T) of the connector (C), comprising:
  a connector holder (12) adapted to hold the connector (C) and formed with probe insertion holes (12e) through which the probes (16, 17) are insertable for contact with the terminal fittings (T) of the held connector (C),
  first and second probe holders (13, 14) carrying the respective probes (16, 17), and
  a relative displacement mechanism (18; 19; 15; 35; 118) for relatively displacing at least two of the first probe holder (13), the second probe holder (14) and the connector holder (12) with respect to each other so as to insert the probes (16, 17) into the probe insertion holes (12e) and into contact with the terminal fittings (T) of the held connector (C).

2. An electrical connection testing device according to claim 1, further comprising a base portion (11) to which the first probe holder (13) is secured, and on which the connector holder (12) and the second probe holder (14) are provided for movement toward and away from the first probe holder (13).

3. An electrical connection testing device according to claim 2, wherein the relative displacement mechanism (18; 19; 15; 35; 118) comprises a pushing mechanism (18; 118) for pushing a receiving surface (14d; 13b, 14b) of at least one of the first probe holder (13) and the second probe holder (14) at a side opposite from the connector holder (12), the pushing mechanism (14d; 13b, 14b) being movably coupled to at least one of the first probe holder (13) and the second probe holder (14).

4. An electrical connection testing device according to claim 3, wherein the second probe holder (14) and the connector holder (12) are moved toward the first probe holder (13) by a movement of the pushing mechanism (18; 19) toward the second probe holder (14), thereby positioning the probes (16, 17) at testing positions (FIG. 6B) where they are insertable from opposite sides into testing holes (Cd) of a connector (C) held by the connector holder (12).

5. An electrical connection testing device according to claim 4, wherein the pushing mechanism (18; 118) comprises a lever (19) pivotally mounted at an end of a base portion (11) about one point as a fulcrum (A), and a cam (19b) for pushing one of a receiving surface (14d; 14a) of the second probe holder (14) and a receiving surface (13a) of the first probe holder(13) as the lever (19) is pivoted.

6. An electrical connection testing device according to claim 1, wherein the relative displacement mechanism (18; 19; 15; 35; 118) comprises a retraction linking mechanism (15; 35) for moving the second probe holder (14) and the connector holder (12) together to retracted positions (FIG. 6A) where the connector (C) can be at least partly mounted into and taken out of the connector holder (12).

7. An electrical connection testing device according to claim 1, wherein the relative displacement mechanism (18; 19; 15; 35; 118), comprises springs (15a; 15b) provided between the first probe holder (13) and the connector holder (12) and between the connector holder (12) and the second probe holder (14) for biasing the holders (13, 14) in directions away from each other.

8. An electrical connection testing device according to claim 6, wherein the retraction linking mechanism (15; 35) comprises first and second links (35a, 35b) provided between the connector holder (12) and the second probe holder (14) and between the second probe holder (14) and the relative displacement mechanism (18; 19; 15; 35; 118).

9. An electrical connection testing device according to claim 1, wherein the probe insertion holes (12e) are formed in substantially opposite side wall portions (12c) of the connector holder (12) and wherein first and a second probe holders are arranged in such a manner as to substantially face the opposite side surfaces of the connector holder (12).

10. An electrical connection testing device according to claim 1, wherein at least one of the first and second probe holders (13, 14) comprises a stopper (20; 21) for preventing relative movements of the first and/or second probe holders (13, 14) to the testing positions (FIG. 6A; P1) by interfering with a retainer (Ce) when the retainer (Ce) mounted on the connector (C) is insufficiently inserted.

11. An electrical connection testing device according to claim 1,
  wherein a pair of probe holders (13, 14) is arranged to move toward and away from the opposite side surfaces of the connector holder (12).

12. An electrical connection testing device according to claim 11, wherein the relative movement mechanism (18; 19; 15; 35; 118) comprises springs (115c, 115d) for biasing the probe holders (13, 14) toward the connector holder (12) to be positioned at testing positions (P1) where the probes (16, 17) are inserted through the testing holes (Cd) of the connector (C) held in the connector holder (12).

13. An electrical connection testing device according to claim 12, wherein the relative movement mechanism (18; 19; 15; 35; 118) comprises a cam (118) that is pivotable about a fulcrum (A), the cam (118) having a pair of pushing surfaces (118a; 118b) projecting in two substantially opposite directions with the fulcrum (A) as a center, the cam (118) being provided on one side wall of the connector holder (12), and the probe holders (13, 14) being formed with guide surfaces (13a, 14a) with which the corresponding pushing surfaces (118a, 118b) can come into contact, wherein the pushing surfaces (118a, 118b) push the guide surfaces (13a, 14a) of the probe holders (13, 14) by the rotation of the cam (118), thereby moving the probe holders (13, 14) away from the connector holder (12), against biasing forces of the springs (115c, 115d) to retracted positions (P2) where the connector (C) can be at least partly inserted into and taken out of the connector holder (12).

14. An electrical connection testing device according to claim 13, wherein the cam (118) is secured to a lever (19) pivotal about the fulcrum (A) and is rotated by a pivotal movement of the lever (19).

15. An electrical connection testing method for testing electrical connections of terminal fittings (T) at least partly accommodated in a connector (C), comprising the following steps:

providing a connector (C) having testing holes (Ce) formed in side walls (Cb) of a connector housing (Ca);

inserting the connector (C) into a connector holder (12) formed with probe insertion holes (12e) substantially corresponding to the testing holes (Ce);

relatively displacing at least two of a first probe holder (13), a second probe holders (13, 14) carrying respective one or more probes (16, 17) and the connector holder (12) with respect to each other so as to at least partly insert the probes (16, 17) into the probe insertion holes (12e) and the testing holes (Cd) for contact with the terminal fittings (T) of the held connector (C); and testing the terminals fittings (T) at least partly accommodated in the connector (C) by means of the probes.

* * * * *